United States Patent
Biing-Jye et al.

(10) Patent No.: US 6,169,294 B1
(45) Date of Patent: Jan. 2, 2001

(54) INVERTED LIGHT EMITTING DIODE

(75) Inventors: Lee Biing-Jye; Jou Ming-Jiunn; Jacob C. Tarn; Chuan-Ming Chang; Liu Chia-Cheng, all of Hsin-Chu (TW)

(73) Assignee: Epistar Co., Hsin-Chu (TW)

( * ) Notice: Under 35 U.S.C. 154(b), the term of this patent shall be extended for 0 days.

(21) Appl. No.: 09/149,260

(22) Filed: Sep. 8, 1998

(51) Int. Cl.[7] .................................................. H01L 27/15
(52) U.S. Cl. ........................ 257/79; 257/99; 257/103; 257/621; 257/622
(58) Field of Search ................. 257/79, 88, 99, 257/103, 621, 622, 624

(56) References Cited

U.S. PATENT DOCUMENTS 5,744,857 * 4/1998 Yamamoto ............................ 257/99
5,925,898 * 7/1999 Spaeth .................................. 257/99

FOREIGN PATENT DOCUMENTS 2-290084 * 11/1990 (JP) ......................................... 257/99

OTHER PUBLICATIONS

F. F. Fang et al., "Merging Semiconductor Optoelectronics with Silicon Technology" IBM Technical Disclosure Bulletin, vol. 19, No. 10 (Mar. 1977) pp. 3959–3960.*

* cited by examiner

Primary Examiner—J. Carroll

(57) ABSTRACT

A nitride light emitting diode is fabricated on a transparent sapphire substrate. The LED is then mounted upside-down on a conductive silicon substrate with a bottom electrode to serve as the output terminal for the cathode of the LED. The LED die is partially etched to expose the anode of the LED, where a top electrode is formed. In comparison with conventional LED structure with both electrodes located on top of the die, moving one electrode to the bottom allows more light to be transmitted upward and reflects the light incident downward. For equal amount of light emission, the new structure occupies less area.

4 Claims, 4 Drawing Sheets

INVERTED LIGHT EMITTING DIODE

BACKGROUND OF THE INVENTION

This invention relates to semiconductor light emitting diodes—in particular to light emitting diodes fabricated with III–V compound semiconductor.

Among all the III–V compound semiconductor family, nitride material has the highest energy bandgap. The light emitting wavelength ranges from violet color to yellow color. It is most suitable for short wavelength, high efficiency devices. Although researchers have devoted a great deal of effort to develop this device, the product has not been commercialized due to the following reasons:

1. No suitable substrate material to match the crystalline structure.

2. Difficulty to grow Indium-gallium nitride (InGaN), especially that with high indium content.

3. Difficulty to grow high concentration p-type gallium nitride (GaN); and

4. Difficulty to form good electrode.

In 1993, the Nichia Chemical Industries Ltd. in Japan announced success in making a first commercial blue color light emitting diode using gallium nitride material. Subsequently, the company further develop a green color light emitting diode. At present, many research organizations have devoted a great deal of resources to develop such a product. Due to the foregoing difficulties, only very few have obtained breakthroughs and commercial success.

The structure used by the Nichia Chemical Industries Ltd. is shown in FIG. 1. A sapphire substrate is sequentially grown with gallium nitride (GaN) nucleation layer, an n-type gallium nitride (GaN) buffer layer, an n-type aluminum gallium nitride (AlGaN) cladding layer, an undoped quantum well light emitting layer, a p-type AlGaN cladding layer, and a p-type GaN contact layer. The structure is coated with nickel-gold (NiAu) light transmitting electrode and p-type NiAu. Due to the fact that the sapphire is an insulator, it is necessary to etch a section of the light emitting diode to contact the n-type cladding layer and to form an n-type titanium aluminum electrode. Such a traditional technique has the following shortcomings:

1. The carrier concentration of the p-type gallium nitride contact layer is less than $1*10^{18} cm^{-3}$ after thermal annealing. The resistivity is high around 1 ohm-cm. Due to such a high resistivity, the current flowing down from the electrode cannot distribute evenly to the die. The uneven current distribution causes current crowding and lowers the light emitting efficiency.

The prior art shown in FIG. 1 uses a very thin nickel-gold layer of less than few hundred angstroms (A) as a current spreading layer to effectively spread the current over the entire die. However, such a current spreading layer has a transmittance of less than 50%. The major portion of the light emitted from the light emitting diode is absorbed by the current spreading layer to lower the light emitting efficiency.

2. In a conventional structure, the p-type and n-type electrodes both lie on the same side of the die and bonding pad must have a diameter lager than 100 μm. The light intensity of an LED is directly related to the operation current density and to the emitting area. Furthermore a lower current density increases the reliability of the LED. For InGaN light emitting diode using sapphire substrate, the die size is 350×350 μm. For high intensity aluminum-gallium-indium light emitting diode, the die size is between 225×225 μm and 300×300 μm. The reason why the InGaN die occupies a larger area is that a portion of the area is used for wire bonding. For a 2 inch wafer with a yield of 100%, the number of InGaN light emitting diode dice is 16500. On the other hand, the number of AlGaInP light emitting diode dice is between 22500 and 40000. If the die size of the InGaN light emitting diodes can be reduced, the productivity is increased and the cost can be reduced.

3. A traditional InGaN light emitting diode using an insulating substrate has the electrodes formed on the same plane. When packaged, the two bonding wires must be wire bonded on the same side. Such a bonding method is incompatible to conventional bonding method and is not cost effective.

SUMMARY OF THE INVENTION

An object of this invention is to avoid the use of the light-transmitting layer of an InGaN light emitting diode, thus increasing the light efficiency of the LED. Another object of this invention is to provide single wire bonding contacts to the light emitting diode. Still another object of this invention is to reduce the manufacturing cost by using a small die size.

These objects are achieved by inverting an LED fabricated on a transparent sapphire substrate and mounting the inverted structure on a conductive silicon substrate. The cathode of the LED is connected to the top electrode of the silicon substrate. The surface of the silicon substrate is partially etched where a top anode is formed. In comparison with a conventional InGaN LED with both electrodes on the same side of the LED chip forming electrodes on two sides of the silicon substrate allows more light to be emitted through the sapphire. In addition, by coating a reflector layer underneath the LED which reflects light incident toward the bottom, the light efficiency can be increased. Since the cathode of the LED chip does not serve as a wire bonding pad, its area can be reduced, resulting in a reduction of the LED chip size.

DETAILED DESCRIPTION OF THE PREFERRED EMBODIMENT

Figure 1:
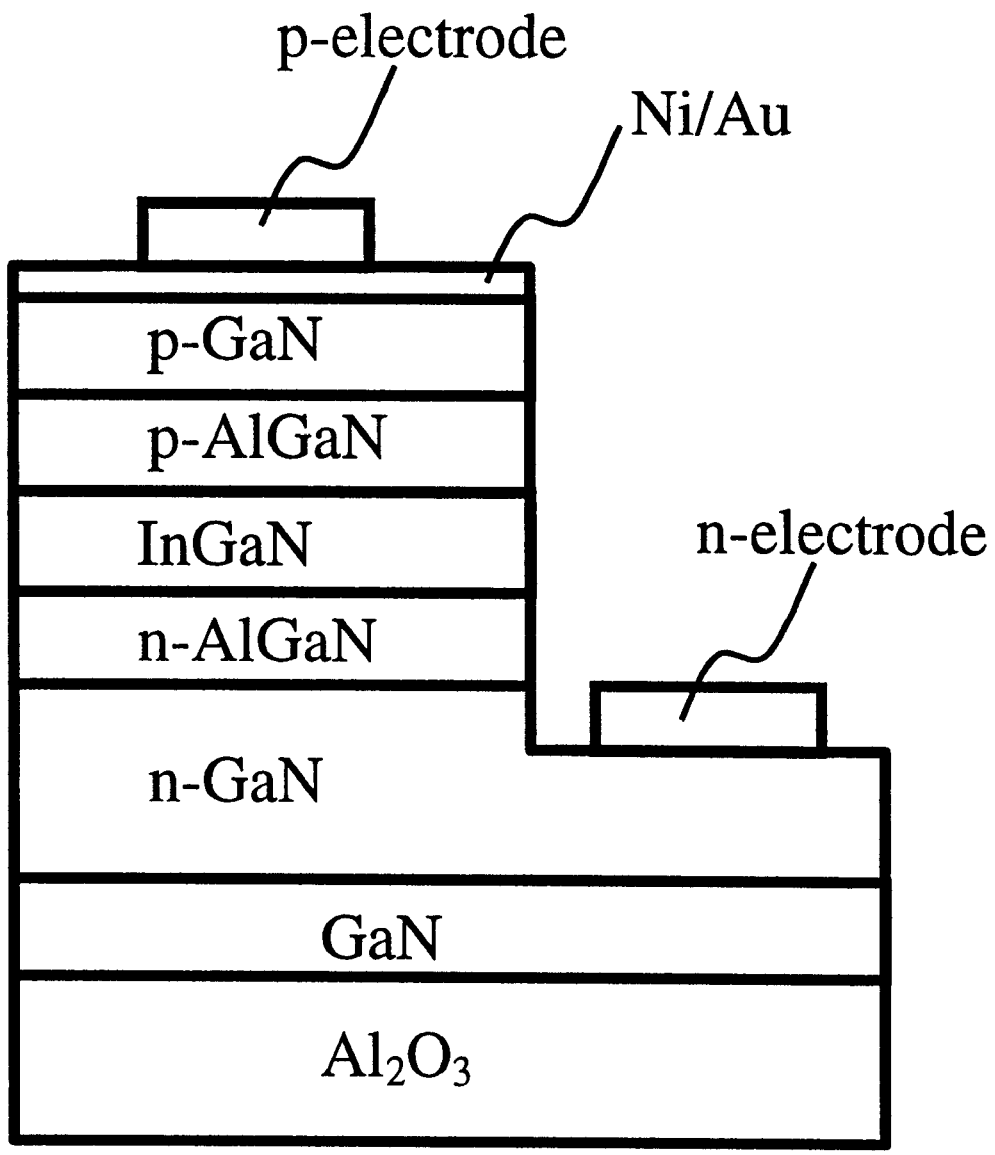
FIG. 1 shows the structure of a prior art InGaN light emitting diode.
Figure 2A:
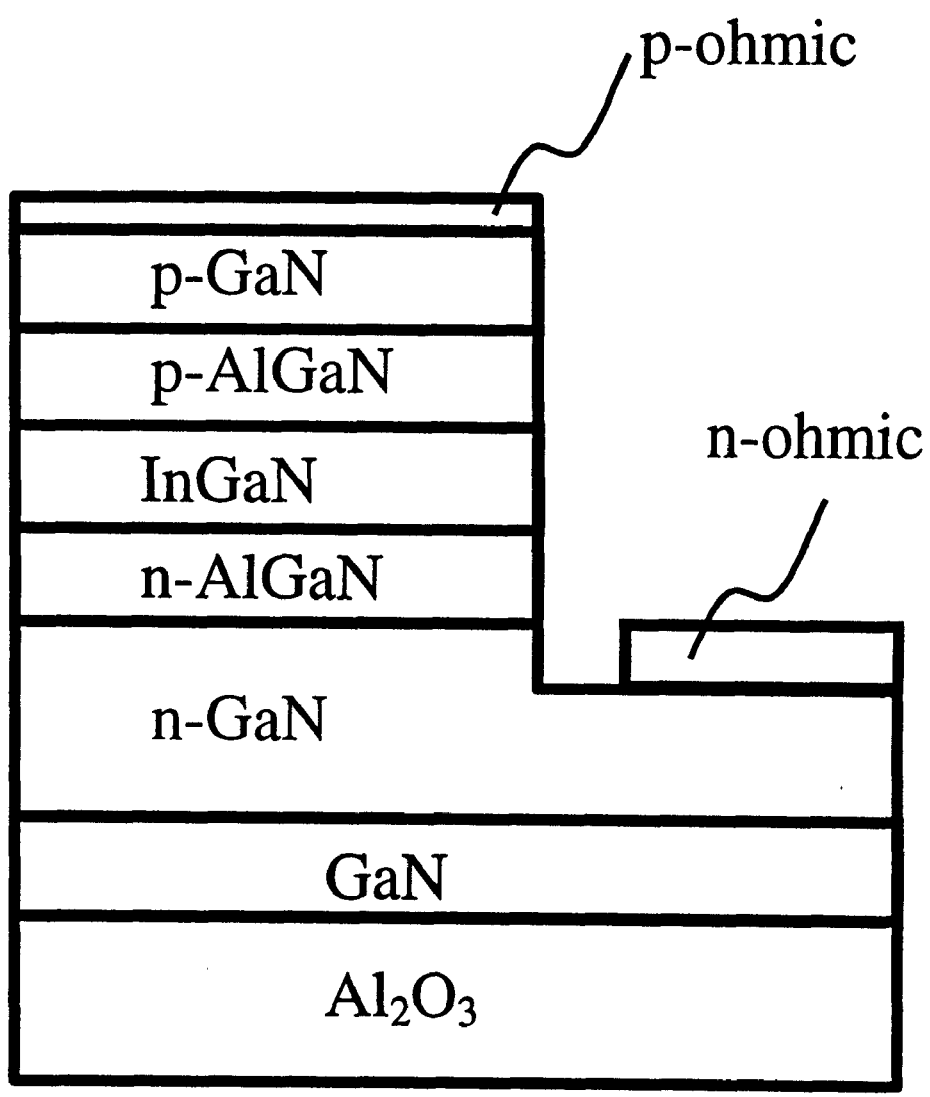
FIG. 2A shows the structure of an InGaN light emitting diode with partially etched surface based on the present invention.

The inverted InGaN light emitting diode has a portion of the structure similar to the traditional InGaN light emitting diode. As shown in FIG. 2A, the structure is similar to the prior art structure shown in FIG. 1 up to the unetched p-GaN layer, where a p-type ohmic layer is plated. Another n-type ohmic layer is plated over the etched section of the structure over the n-type GaN layer.

Next, the structure in FIG. 2A is inverted and placed over an n-type silicon (Si) substrate. The bottom of the n-type Si substrate is deposited with an n-type electrode (n-electrode). The major portion of the n-type Si substrate is etched to a depth of 1–3 μm, covered with an insulating layer of silicon diode ($SiO_2$) or silicon nitride (SiNx), then a layer of contact metal and a layer of solder to be soldered to the p-type ohmic contact of the light emitting diode shown in FIG. 2A. Over the unetched plane of the Si substrate is deposited an n-type metal (n-metal) and a layer of solder for making ohmic contact to the n-substrate.

Figure 2B:
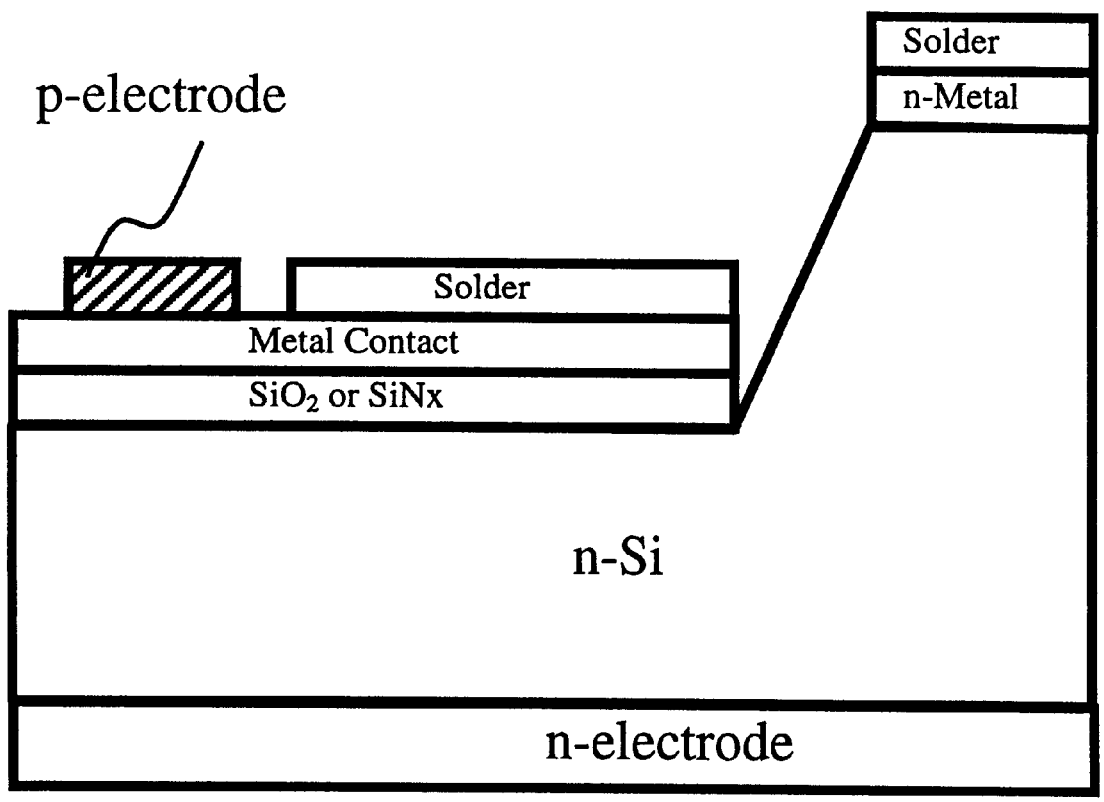
FIG. 2B shows the structure of the silicon substrate based on the present invention.
Figure 3:
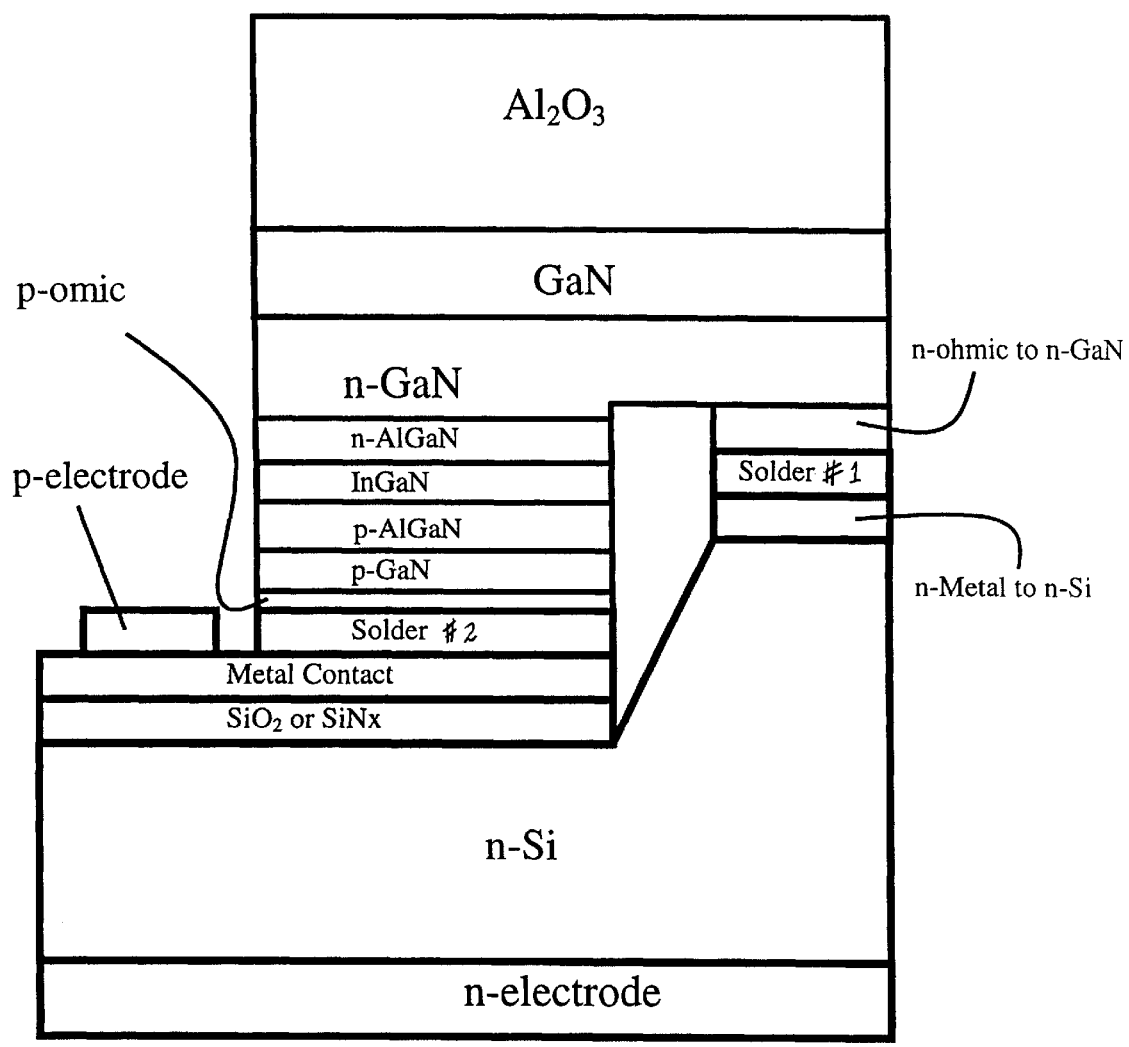
FIG. 3 shows the structure of an inverted InGaN light emitting diode mounted on the silicon substrate.

Finally, the InGaN light emitting diode structure shown in FIG. 2A is placed upside down over the substrate shown in FIG. 2B. After metal bonding the two parts are connected together with solder such as Au—Sn solder.

The present invention has several advantages:

(1) The light emitting diode has a high light extraction efficiency and current spreading effect. The light emitting diode is grown over the transparent sapphire substrate ($Al_2O_3$). When the light emitting diode is placed upside down over the silicon substrate, the light emitted from the light emitting layer can efficiently transmit through the transparent sapphire layer. In addition, the bottom of the p-type GaN layer has an entire area plated with an ohmic layer such as Ni/Au. Without worrying about the light transmission efficiency, this metallic layer can exceed 100 Å thick for more even current distribution than the conventional thin Au—Ni layer. Besides a reflecting layer may be plated under the ohmic layer to reflect the light incident downward back toward the sapphire for radiation.

(2) The die size of this invention is reduced. The n-type ohmic contact layer to the n-GaN layer of the InGaN light emitting diode is soldered to the n-Metal contact (such as titanium, aluminum) of the Si substrate without requiring an extra bonding pad. Thus the area of the device is greatly reduced. Whereas the area of a traditional InGaN light emitting diode is approximately equal to 350×350 μm, the inverted structure of this present invention can be reduced to between 275×275 μm and 300×300 μm. Thus the number of dice per wafer can be increased by 62% and 36%, respectively.

(3) Compared to traditional package technique, the present invention uses a low cost silicon as a substrate. Not only is the production cost low, but also the substrate is conductive. During packaging, the substrate need only be coated with a layer of silver epoxy for conducting to a lead frame, and the p-type electrode is wire bonded to another lead frame. This packaging method is compatible with traditional practice.

While the preferred embodiment of the invention has been shown and described, it will be apparent to those skilled in the art that various modifications may be made in the embodiment without departing from the spirit of the present invention. Such modifications are all within the scope of the present invention.

What is claimed is:

1. An inverted light emitting diode comprising:

a conducting substrate having a first surface and a partially etched second surface;

a first electrode formed on said first surface;

a first type electrode contact layer formed on an unetched portion of said second surface;

a first soldering layer formed over said first type electrode for connecting to the ohmic contact layer of said light emitting diode;

an insulating layer formed on said partially etched second surface;

a metal layer formed on said insulating layer;

a second electrode formed on a section of said metal layer; and a second soldering layer formed over a second section of said metal layer for connecting the second ohmic contact layer of said light emitting diode.

2. An inverted light emitting diode as described in claim 1, wherein said conductive substrate is selected from a group consisting of silicon, gallium arsenide, gallium phosphide and silicon carbide.

3. An inverted light emitting diode as described in claim 1, wherein said first soldering layer is selected from a group consisting of: gold-tin compound and indium metal.

4. An inverted light emitting diode as described in claim 1, further comprising:

a first type ohmic contact layer formed over said first soldering layer;

a second type ohmic contact layer formed over said second soldering layer;

a second type cladding layer formed over said second ohmic contact layer;

a light emitting layer formed over said second type cladding layer;

a first type cladding layer formed over said light emitting layer;

a buffer layer formed over said first type cladding layer and said first type ohmic contact layer;

a nucleation layer formed over said buffer layer; and a transparent insulating layer formed over said nucleation layer.

* * * * *